(12) United States Patent
Saxby

(10) Patent No.: US 11,609,590 B2
(45) Date of Patent: Mar. 21, 2023

(54) POWER SUPPLY FOR ELECTRIC UTILITY UNDERGROUND EQUIPMENT

(71) Applicant: Sentient Technology Holdings, LLC, Wichita, KS (US)

(72) Inventor: Dennis Allen Saxby, Los Gatos, CA (US)

(73) Assignee: SENTIENT TECHNOLOGY HOLDINGS, LLC, Wichita, KS (US)

( * ) Notice: Subject to any disclaimer, the term of this patent is extended or adjusted under 35 U.S.C. 154(b) by 156 days.

(21) Appl. No.: 16/781,837

(22) Filed: Feb. 4, 2020

(65) Prior Publication Data
US 2020/0249711 A1    Aug. 6, 2020

Related U.S. Application Data

(60) Provisional application No. 62/800,926, filed on Feb. 4, 2019.

(51) Int. Cl.
*G05F 1/577* (2006.01)
*H02H 9/00* (2006.01)
(Continued)

(52) U.S. Cl.
CPC .............. *G05F 1/577* (2013.01); *G05F 1/613* (2013.01); *G05F 5/00* (2013.01); *H02G 9/06* (2013.01);
(Continued)

(58) Field of Classification Search
CPC . G05F 1/577; G05F 5/00; G05F 1/613; G05F 1/46; G05F 1/56; G05F 1/565;
(Continued)

(56) References Cited

U.S. PATENT DOCUMENTS 3,075,166 A    1/1963   Peek
3,435,294 A    3/1969   Lemma
(Continued)

FOREIGN PATENT DOCUMENTS

CN    104822192 A  *  8/2015
EP       1508146 A      2/2005
(Continued)

OTHER PUBLICATIONS

Chen et al.; Development of arc-guided protection devices against lightning breakage of covered iconductors on distribution lines; IEEE Trans. Power Deliv.; 25(1); pp. 196-205; Jan. 2010.
(Continued)

*Primary Examiner* — Jung Kim

(57) ABSTRACT

A power supply device may include a connector configured to electrically couple the power supply device to a conductor of the underground power lines; a voltage divider configured to receive an input voltage from the conductor, the voltage divider comprising a capacitor and divider voltage control electronics in series with the capacitor; and, a surge resistor in series with the capacitor and configured to provide impulse protection from surge events. The divider voltage control electronics may be configured to regulate an output voltage of the voltage divider to support variable loads on the voltage divider.

18 Claims, 4 Drawing Sheets

(51) Int. Cl.

| | |
|---|---|
| *H02M 1/00* | (2006.01) |
| *H02G 9/06* | (2006.01) |
| *H02M 1/32* | (2007.01) |
| *H02M 7/04* | (2006.01) |
| *H02M 7/06* | (2006.01) |
| *G05F 5/00* | (2006.01) |
| *G05F 1/613* | (2006.01) |

(52) U.S. Cl.
CPC ............ *H02H 9/001* (2013.01); *H02H 9/005* (2013.01); *H02M 1/0045* (2021.05); *H02M 1/32* (2013.01); *H02M 7/043* (2013.01); *H02M 7/062* (2013.01)

(58) Field of Classification Search
CPC ...... H02H 9/005; H02H 1/0061; H02H 9/041; H02M 1/0045; H02M 1/32; H02M 7/06
See application file for complete search history.

(56) References Cited

U.S. PATENT DOCUMENTS

| | | |
|---|---|---|
| 3,558,984 A | 1/1971 | Smith et al. |
| 3,676,740 A | 7/1972 | Schweitzer, Jr. |
| 3,686,531 A | 8/1972 | Decker et al. |
| 3,702,966 A | 11/1972 | Schweitzer, Jr. |
| 3,708,724 A | 1/1973 | Schweitzer, Jr. |
| 3,715,742 A | 2/1973 | Schweitzer, Jr. |
| 3,720,872 A | 3/1973 | Russell et al. |
| 3,725,832 A | 4/1973 | Schweitzer, Jr. |
| 3,755,714 A | 8/1973 | Link |
| 3,768,011 A | 10/1973 | Swain |
| 3,777,217 A | 12/1973 | Groce et al. |
| 3,814,831 A | 6/1974 | Olsen |
| 3,816,816 A | 6/1974 | Schweitzer, Jr. |
| 3,866,197 A | 2/1975 | Schweitzer, Jr. |
| 3,876,911 A | 4/1975 | Schweitzer, Jr. |
| 3,957,329 A | 5/1976 | McConnell |
| 3,970,898 A | 7/1976 | Baumann et al. |
| 4,063,161 A | 12/1977 | Pardis |
| 4,152,643 A | 5/1979 | Schweitzer, Jr. |
| 4,339,792 A | 7/1982 | Yasumura et al. |
| 4,378,525 A | 3/1983 | Burdick |
| 4,396,794 A | 8/1983 | Stiller |
| 4,396,968 A | 8/1983 | Stiller |
| 4,398,057 A | 8/1983 | Shankle et al. |
| 4,408,155 A | 10/1983 | McBride |
| 4,466,071 A | 8/1984 | Russell, Jr. |
| 4,558,229 A * | 12/1985 | Massey ................ H02M 7/068 363/75 |
| 4,559,491 A | 12/1985 | Saha |
| 4,570,231 A | 2/1986 | Bunch |
| 4,584,523 A | 4/1986 | Elabd |
| 4,649,457 A | 3/1987 | Talbot et al. |
| 4,654,573 A | 3/1987 | Rough et al. |
| 4,709,339 A | 11/1987 | Fernandes |
| 4,714,893 A | 12/1987 | Smith Vaniz et al. |
| 4,723,220 A | 2/1988 | Smith Vaniz |
| 4,728,887 A | 3/1988 | Davis |
| 4,746,241 A | 5/1988 | Burbank |
| 4,766,549 A | 8/1988 | Schweitzer, III et al. |
| 4,775,839 A | 10/1988 | Kosina et al. |
| 4,808,916 A | 2/1989 | Smith-Vaniz |
| 4,827,272 A | 5/1989 | Davis |
| 4,829,298 A | 5/1989 | Fernandes |
| 4,881,028 A | 11/1989 | Bright |
| 4,886,980 A | 12/1989 | Fernandes et al. |
| 4,937,769 A | 6/1990 | Verbanets |
| 4,904,932 A | 12/1990 | Schweitzer, Jr. |
| 5,006,846 A | 4/1991 | Granville et al. |
| 5,125,738 A | 6/1992 | Kawamura et al. |
| 5,138,265 A | 8/1992 | Kawamura et al. |
| 5,159,561 A | 10/1992 | Watanabe et al. |
| 5,181,026 A | 1/1993 | Granville |
| 5,182,547 A | 1/1993 | Griffith |
| 5,202,812 A | 4/1993 | Shinoda et al. |
| 5,206,595 A | 4/1993 | Wiggins et al. |
| 5,220,311 A | 6/1993 | Schweitzer, Jr. |
| 5,428,549 A | 6/1995 | Chen |
| 5,438,256 A | 8/1995 | Thuries et al. |
| 5,473,244 A | 12/1995 | Libove et al. |
| 5,495,169 A | 2/1996 | Smith |
| 5,537,044 A | 7/1996 | Stahl |
| 5,550,476 A | 8/1996 | Lau et al. |
| 5,565,783 A | 10/1996 | Lau et al. |
| 5,600,248 A | 2/1997 | Westrom et al. |
| 5,608,328 A | 3/1997 | Sanderson |
| 5,650,728 A | 7/1997 | Rhein et al. |
| 5,656,931 A | 8/1997 | Lau et al. |
| 5,682,100 A | 10/1997 | Rossi et al. |
| 5,696,788 A | 12/1997 | Choi et al. |
| 5,712,796 A | 1/1998 | Ohura et al. |
| 5,729,144 A | 3/1998 | Cummins |
| 5,737,203 A | 4/1998 | Barrett |
| 5,764,065 A | 6/1998 | Richards et al. |
| 5,839,093 A | 11/1998 | Novosel et al. |
| 5,841,204 A | 11/1998 | English |
| 5,892,430 A | 4/1999 | Wiesman et al. |
| 5,905,646 A | 5/1999 | Crewson et al. |
| 5,990,674 A | 11/1999 | Schweitzer, Jr. |
| 6,002,260 A | 12/1999 | Lau et al. |
| 6,016,105 A | 1/2000 | Schweitzer, Jr. |
| 6,043,433 A | 3/2000 | Schweitzer, Jr. |
| 6,133,723 A | 10/2000 | Feight |
| 6,133,724 A | 10/2000 | Schweitzer, Jr. et al. |
| 6,288,632 B1 | 9/2001 | Hoctor et al. |
| 6,292,340 B1 | 9/2001 | O'Regan et al. |
| 6,347,027 B1 | 2/2002 | Nelson et al. |
| 6,433,698 B1 | 8/2002 | Schweitzer, Jr. et al. |
| 6,459,998 B1 | 10/2002 | Hoffman |
| 6,466,030 B2 | 10/2002 | Hu et al. |
| 6,466,031 B1 | 10/2002 | Hu et al. |
| 6,477,475 B1 | 11/2002 | Takaoka et al. |
| 6,483,435 B2 | 11/2002 | Saha et al. |
| 6,525,558 B2 | 2/2003 | Kim et al. |
| 6,549,880 B1 | 4/2003 | Willoughby et al. |
| 6,559,651 B1 | 5/2003 | Crick |
| 6,566,854 B1 | 5/2003 | Hagmann et al. |
| 6,577,108 B2 | 6/2003 | Hubert et al. |
| 6,601,001 B1 | 7/2003 | Moore |
| 6,622,285 B1 | 9/2003 | Rust et al. |
| 6,677,743 B1 | 1/2004 | Coolidge et al. |
| 6,718,271 B1 | 4/2004 | Tobin |
| 6,734,662 B1 | 5/2004 | Fenske |
| 6,798,211 B1 | 9/2004 | Rockwell et al. |
| 6,801,027 B2 | 10/2004 | Hann et al. |
| 6,822,457 B2 | 11/2004 | Borchert et al. |
| 6,822,576 B1 | 11/2004 | Feight et al. |
| 6,879,917 B2 | 4/2005 | Turner |
| 6,894,478 B1 | 5/2005 | Fenske |
| 6,914,763 B2 | 7/2005 | Reedy |
| 6,917,888 B2 | 7/2005 | Logvinov et al. |
| 6,927,672 B2 | 8/2005 | Zalitzky et al. |
| 6,949,921 B1 | 9/2005 | Feight et al. |
| 6,963,197 B1 | 11/2005 | Feight et al. |
| 6,980,090 B2 | 12/2005 | Mollenkopf |
| 7,023,691 B1 | 4/2006 | Feight et al. |
| 7,046,124 B2 | 5/2006 | Cope et al. |
| 7,053,601 B1 | 5/2006 | Fenske et al. |
| 7,072,163 B2 | 7/2006 | McCollough, Jr. |
| 7,076,378 B1 | 7/2006 | Huebner |
| 7,085,659 B2 | 8/2006 | Peterson et al. |
| 7,106,048 B1 | 9/2006 | Feight et al. |
| 7,158,012 B2 | 1/2007 | Wiesman et al. |
| 7,187,275 B2 | 3/2007 | McCollough, Jr. |
| 7,203,622 B2 | 4/2007 | Pan et al. |
| 7,272,516 B2 | 9/2007 | Wang et al. |
| 7,295,133 B1 | 11/2007 | McCollough, Jr. |
| 7,400,150 B2 | 7/2008 | Cannon |
| 7,424,400 B2 | 9/2008 | McCormack et al. |
| 7,449,991 B2 | 11/2008 | Mollenkopf |
| 7,450,000 B2 | 11/2008 | Gidge et al. |
| 7,508,638 B2 | 3/2009 | Hooper |
| 7,518,529 B2 | 4/2009 | O'Sullivan et al. |

(56) References Cited

U.S. PATENT DOCUMENTS

| | | | |
|---|---|---|---|
| 7,532,012 B2 | 5/2009 | Cern |
| 7,557,563 B2 | 7/2009 | Gunn et al. |
| 7,626,794 B2 | 12/2009 | Swartzendruber et al. |
| 7,633,262 B2 | 12/2009 | Lindsey et al. |
| 7,672,812 B2 | 3/2010 | Stoupis et al. |
| 7,683,798 B2 | 3/2010 | Rostron |
| 7,701,356 B2 | 4/2010 | Curt et al. |
| 7,714,592 B2 | 5/2010 | Radtke et al. |
| 7,720,619 B2 | 5/2010 | Hou |
| 7,725,295 B2 | 5/2010 | Stoupis et al. |
| 7,742,393 B2 | 6/2010 | Bonicatto et al. |
| 7,764,943 B2 | 7/2010 | Radtke |
| 7,795,877 B2 | 9/2010 | Radtke et al. |
| 7,795,994 B2 | 9/2010 | Radtke |
| 7,804,280 B2 | 9/2010 | Deaver, Sr. et al. |
| 7,930,141 B2 | 4/2011 | Banting |
| 8,421,444 B2 | 4/2013 | Gunn |
| 8,497,781 B2 | 7/2013 | Engelhardt et al. |
| 8,594,956 B2 | 11/2013 | Banting et al. |
| 8,786,292 B2 | 7/2014 | Parsons |
| 9,182,429 B2 | 11/2015 | Saxby et al. |
| 9,229,036 B2 | 1/2016 | Kast et al. |
| 9,448,257 B2 | 9/2016 | Saxby et al. |
| 9,581,624 B2 | 2/2017 | Rostron et al. |
| 9,954,354 B2 | 4/2018 | Baker et al. |
| 9,984,818 B2 | 5/2018 | Rumrill |
| 2004/0156154 A1 | 8/2004 | Lazarovich et al. |
| 2005/0073200 A1 | 4/2005 | Divan et al. |
| 2008/0077336 A1 | 3/2008 | Fernandes |
| 2009/0033293 A1 | 2/2009 | Xing et al. |
| 2009/0058582 A1 | 3/2009 | Webb |
| 2009/0309754 A1 | 12/2009 | Bou et al. |
| 2010/0085036 A1 | 4/2010 | Banting et al. |
| 2011/0032739 A1 | 2/2011 | Juhlin |
| 2012/0039062 A1 | 2/2012 | McBee et al. |
| 2012/0236611 A1 | 9/2012 | Alexandrov et al. |
| 2013/0162136 A1 | 6/2013 | Baldwin et al. |
| 2014/0062221 A1 | 3/2014 | Papastergiou et al. |
| 2014/0145858 A1 | 5/2014 | Miller et al. |
| 2014/0174170 A1 | 6/2014 | Davis |
| 2014/0192458 A1 | 7/2014 | Valdes |
| 2014/0226366 A1 | 8/2014 | Morokuma et al. |
| 2014/0260598 A1 | 9/2014 | Miller |
| 2015/0198667 A1 | 7/2015 | Krekeler |
| 2016/0116505 A1 | 4/2016 | Kast et al. |
| 2017/0199533 A1 | 7/2017 | McCollough |
| 2018/0143234 A1 | 5/2018 | Saxby |

FOREIGN PATENT DOCUMENTS

| | | |
|---|---|---|
| EP | 1938159 A | 7/2008 |
| EP | 2340592 A | 7/2011 |
| EP | 2350764 A | 8/2011 |

OTHER PUBLICATIONS

Chen Yang Technologies; Split core hall effect dc current sensor CYHCT-C2TC; 4 pages; retrieved from the internet Jan. 5, 2015 (http://www.hallsensors.de/CYHCT-C2TC.pdf) (Product Information).
Saha et al.; Fault Location on Power Networks (Power Systems); Springer Verlag; London, UK; 435 pgs.; 2010 (Preface: Oct. 2009).
Shepard et al.; An overview of rogowski coil current sensing technology; 13 pages; retrieved from the internet Jan. 5, 2016 (http://www.dynamp.net/ldadocum.nsf/c2270fbdd892ac3e86256e75000ad88a/e710af6d3e0f6255862565d7004b19db/$FILE/Report.pdf).
Stringfield et al.; Fault location methods for overhead lines; in Transactions of the American Institute of Electrical Engineers; Amer. Inst. of Electrical Eng.; New York, NY; Part. III; vol. 76; pp. 518-530; Aug. 1957.
Rumrill; U.S. Appl. No. 16/574,465 entitled "Systems and methods to measure primary/voltage using capacitive coupled test point and grounded sensor circuit," filed Sep. 18, 2019.
Rumrill; U.S. Appl. No. 16/574,486 entitled "Distrubance detecting current sensor," filed Sep. 18, 2019.
Rumrill; U.S. Appl. No. 16/575,220 entitled "Systems and methods to maximize power from multiple power line energy harvesting devices," filed Sep. 18, 2019.
Pierce et al.; U.S. Appl. No. 16/653,583 entitled "Power line sensors with automatic phase indetification," filed Oct. 15, 2019.
Reader et al.; U.S. Appl. No. 16/700,888 entitled "Sensor voltage phase angle correction," filed Dec. 2, 2019.
Petit; U.S. Appl. No. 16/714,541 entitled "Multi-phase simuiation environment," filed Dec. 13, 2019.
International search report and written opinion received for PCT application No. PCT/US20/16626, dated Jun. 3, 2020, 8 pages.

* cited by examiner

POWER SUPPLY FOR ELECTRIC UTILITY UNDERGROUND EQUIPMENT

CROSS REFERENCE TO RELATED APPLICATIONS

This application claims the benefit of U.S. Provisional Application No. 62/800,926, filed Feb. 4, 2019, herein incorporated by reference in its entirety.

INCORPORATION BY REFERENCE

All publications and patent applications mentioned in this specification are herein incorporated by reference to the same extent as if each individual publication or patent application was specifically and individually indicated to be incorporated by reference.

FIELD

The present application relates generally to distribution line monitoring, sensor monitoring, and sensing and identifying electrical characteristics of a power distribution line. More specifically, this disclosure provides a novel power source for use in electric utility underground equipment applications.

BACKGROUND

Electric utilities have two fundamental choices for distributing electric power to customers; underground or overhead construction. New construction and major replacement projects generally favor underground construction. The primary advantages are improved customer acceptance (i.e., better aesthetics) and higher reliability. The primary disadvantages are the generally higher cost for new construction and the higher cost to locate and implement repairs to existing equipment.

The present disclosure is intended to support measurement equipment that can be used to assist in the ongoing maintenance of underground equipment. This measurement equipment can, for example, report current and voltage present on the underground cable. This measurement data can be returned to an electric utility control center via a communications link (hard-wire, optical, or radio link). The measurement data is valuable not only to locate faulty equipment more efficiently, but for a number of other uses also, for example, load leveling, partial discharge detection, etc.

Underground construction requires most of the same support equipment used in overhead construction, for example, distribution transformers, sectionalizing switches, etc. For underground, this equipment is contained either in a vault (frequently completely below ground level) or in a pad mounted cabinet. Equipment for these two enclosure types is designed using either "live front" or "dead front" construction. As the terms hint, live front equipment has exposed conductors at the system voltage inside the cabinet, dead front equipment has no exposed conductors and all system voltage conductors are insulated.

To support underground measurement equipment, a power source capable of supplying 2 to 10 watts of power is generally needed. Existing solutions obtain this power either using a locally installed PT (voltage transformer) or by inductively harvesting power from the current flowing in one or more of the underground cables. The PT solution has seen limited application due to its high installation cost and also the space required is frequently not available. Inductive harvesting offers a relatively easy installation at moderate cost. The major disadvantage is that the power produced is dependent on the current flowing in the conductor the harvesting transformer is attached to. In many applications, these conductor currents are too small to produce the required 2 to 10 watts of power.

BRIEF DESCRIPTION OF THE DRAWINGS

The novel features of the invention are set forth with particularity in the claims that follow. A better understanding of the features and advantages of the present invention will be obtained by reference to the following detailed description that sets forth illustrative embodiments, in which the principles of the invention are utilized, and the accompanying drawings of which:

SUMMARY OF THE DISCLOSURE

Figure 1:
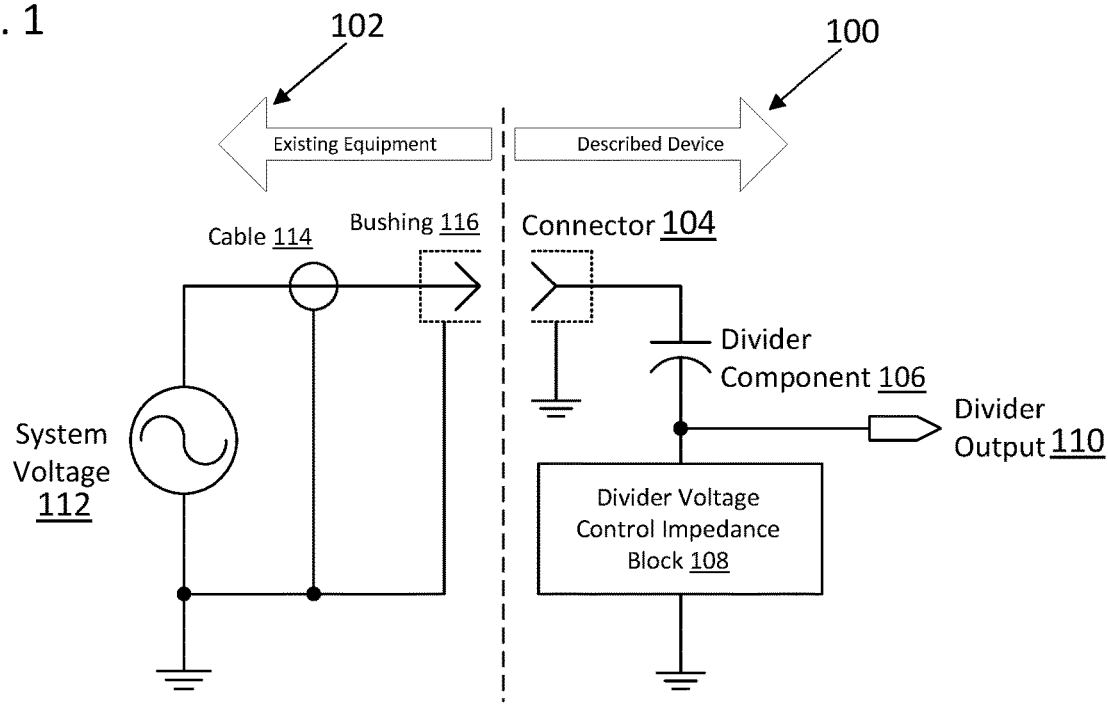
FIG. 1 shows a capacitive voltage divider with the bottom divider component as the "Divider Voltage Control Impedance" block.

A method of powering an electrical component with underground power lines is provided, comprising the steps of electrically coupling a power supply device to a conductor of the underground power lines, providing an input voltage from the conductor to a voltage divider of the power supply device, and regulating an output voltage of the voltage divider to support variable loads on the voltage divider.

In some embodiments, the electrically coupling step comprises attaching a connector of the power supply device to a connector of the underground power lines.

In some embodiments, the input voltage comprises 500 to 1000 volts, or alternatively, 1000 to 2000 volts.

In one embodiment, the output voltage comprises less than or equal to 50 volts.

In some implementations, the voltage divider comprises a capacitor and the divider voltage control electronics.

In one embodiment, regulating the output voltage further comprises producing a reasonably fixed impedance with the divider voltage control electronics regardless of the variable load present on the tap of the voltage divider.

In another embodiment, the voltage divider comprises a resistor and the divider voltage control electronics.

In some embodiments, the method further comprises providing impulse protection from surge events with a surge resistor placed in series with the capacitor.

A power supply device configured to power an electrical component with underground power lines is also provided, comprising a connector configured to electrically couple the power supply device to a conductor of the underground power lines, and a voltage divider configured to receive an input voltage from the conductor, the voltage divider comprising a capacitor and divider voltage control electronics, wherein the divider voltage control electronics are configured to regulate an output voltage of the voltage divider to support variable loads on the voltage divider.

In one embodiment, the divider voltage control electronics comprise a transformer.

In another embodiment, the divider voltage control electronics comprise a variable resistance load circuit configured to maintain a maximum voltage across a filter capacitor.

In one embodiment, the device further comprises a surge resistor placed in series with the capacitor and configured to provide impulse protection from surge events.

DETAILED DESCRIPTION

The present disclosure describes systems and methods configured to supply a voltage from an underground power conductor that can be more readily handled by mainstream semiconductor and magnetic components, such as underground measurement equipment (generally less than 1000 volts). Some implementations described herein are intended to support dead front installations for underground power networks. In some embodiments, the devices described herein are very similar in appearance to a standard elbow connector. It can be connected to either a panel-mounted equipment bushing or a "T" elbow connector of the underground power network. The devices described herein can use the voltage present on the underground conductor it is attached to produce power usable by the aforementioned underground measurement equipment.

The present disclosure can include a voltage divider to supply a voltage that can be more readily handled by mainstream semiconductor and magnetic components (generally less than 1000 volts). The divided system voltage, which can be between 500 and 1000 volts, can then converted to a power supply voltage to be used by measuring equipment. For safety reasons, this voltage is frequently required to be less than approximately 50 volts if it is delivered via a connectorized cable with exposed contacts.

FIG. 1 illustrates a schematic diagram of a power supply device 100 configured to connect to an underground power network 102. As shown in FIG. 1, the power supply device 100 can include a connector 104 configured to electrically couple the power supply device 100 to the underground power network 102. The power supply device 100 can further include a divider component 106, a divider voltage control impedance block 108, and a divider output 110. The divider component 106 and the divider voltage control impedance block 108 together create a voltage divider in the power supply device 100. The underground power network 102 can include a system voltage 112, a cable/conductor 114, and a bushing 116 that provides an electrical connection to the cable/conductor 114.

The embodiments described herein and illustrated in FIG. 1 provide a controlled divider output voltage (also referred to as a power supply voltage) that is controlled with a divider voltage control impedance block. In some embodiments, is desirable for the controlled divider output voltage to be as large as possible to limit the current needed to be sourced through the divider. This limits the power dissipation in the divider components.

Two basic implementations are described herein, one uses a transformer to convert the divided system voltage to the desired power supply voltage ("Transformer Implementation"). The second converts the divided system voltage to DC and uses a switching converter to supply the desired DC power supply voltage ("DC Converter Implementation).

Both of the implementations mentioned above start with the same basic device construction. A standard elbow connector construction can be used to house the device components (shown in more detail in FIG. 5 and described below). This elbow connector construction is used in currently available devices that provide voltage measurement (for example, a resistive divider), impulse protection (for example, lightning and surge arrestors), and fuses.

Referring to FIG. 1, the divider component can be a capacitor designed to support the majority of the system voltage (approximately Vsystem −500-1000V, or alternatively, up to 2000V). Capacitors intended for use in electric utility voltage divider applications are commercially available and have proven reliability in field. In some examples, this capacitor can occupy a significant portion of the length of the elbow connector construction of the device, however its length will be dependent on the system voltage the device is designed to support. In this example, the divider component was chosen to be capacitive rather than resistive to limit the component power dissipation and thereby the heat generated in the component. However, it should be understood that a resistive component can also be implemented.

To obtain a reasonably fixed divider output voltage, the components that make up the divider voltage control impedance block must produce a reasonably fixed impedance regardless of the load present on the divider tap. The described solutions to this problem are described below.

Referring still to FIG. 1, at the system frequency, generally 50 or 60 Hertz, the divider component 106 will have a fixed impedance of $1/(2\pi*f*C)$. In a voltage divider application, when the divider voltage control impedance block 108 has a fixed impedance, the divider output 110 will be determined by the ratio of the two fixed impedances. To obtain an accurate voltage divider ratio, the load on the divider output 110 must also be fixed. In this disclosure, the divider output 110 is connected to a variable load, necessitated by the varying power requirements of the attached equipment. It would be desirable to have this load on the divider output vary from infinite (open circuit) to whatever load impedance is present when the attached measurement device is providing its maximum designed power output. At the block diagram level, this function of varying the load on the divider output is provided by the divider voltage control impedance block 108 of the present disclosure. This function can be implemented in numerous ways. Two possible solutions are described below.

Transformer Implementation

Figure 2:
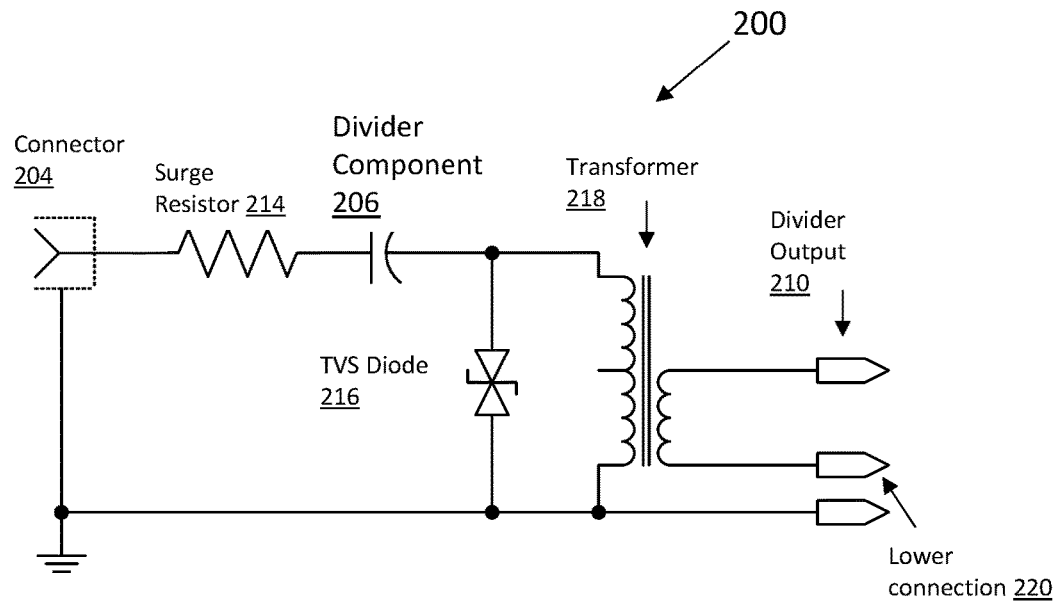
FIG. 2 shows a transformer implementation of a voltage divider.

FIG. 2 illustrates one embodiment of a power supply device 200 that implements the divider voltage control impedance block from FIG. 1 as a transformer 218. The connector 204 and the divider component 206 correspond to the same structures as described in FIG. 1. In this embodiment, the power supply device 200 can further include a surge resistor 214 and a transient-voltage-suppression (TVS) diode 216 to protect the device and the equipment it powers from impulse events. This is described further below. Transformer 218 is designed and configured to inductively support a target voltage of 500 to 1000 volts as previously described.

The divider component 206 can be sized and configured to supply the transformer 218 the primary current needed to produce the desired power out of the secondary winding. Given this, the divider component 206 can have different values for each system voltage class (for example, 15 kV, 25 kV, 35 kV). This requires a different model of device for each voltage class.

For the target 1000 volt divider voltage previously mentioned, a secondary voltage of 20 volts might be chosen. If the divider components were sized to deliver, for example, 5 mA of current through the divider, the secondary would be capable of sourcing 250 mA at 20 volts ([1000/20]*5 mA), or 5 watts in a lossless transformer.

In one implementation, it is proposed to use the transformer magnetic core behavior to control the maximum voltage that can appear on the secondary winding. Again using the example 1000 volt target divider voltage, the primary winding and magnetic core would be designed to support that voltage with good transformer function efficiency (for example, greater than 95%). The transformer can be designed to start saturating the magnetic core as the primary voltage is increased beyond 1000 volts. As the voltage is increased, the primary winding impedance becomes less as the permeability of the core drops. At 1500 or 2000 volts, for example, the primary winding impedance is low enough that the primary winding voltage can no longer increase. Should the transformer primary voltage limit to 2000 volts, for example, the secondary voltage will limit to 40 volts, a safe level for a connectorized implementation.

The Surge Resistor and the TVS Diode shown in FIG. 2 are configured to protect the device and the attached equipment from transient overvoltages. The primary concern are lightning impulses. While these impulses are short in duration (typically less than 200 usec for reasonably proximate strikes that still have significant peak voltage), they can contain significant energy. Semiconductor overvoltage protection devices designed for the expected energy levels are readily available. The TVS diode 216 was chosen here for its tight clamping voltage control and its multiple strike tolerance. TVS diodes are typically available up to 500 volts. In some embodiments, the design can use two or more TVS diodes in series in this application. The surge resistor 214 is included to absorb the majority of the energy during an impulse as little voltage is expected to be dropped across the divider component 206 during impulse events. The sur be designed to dissipate a small amount of power during normal operation (for example, less than 2 watts). The resistor and surrounding insulation will need to support the impulse voltage event.

Switching transients are also common events in electrical distribution systems. While these can be much longer in duration than the lightning impulse (typically less than 10 msec) the peak voltages rarely exceed two times the system voltage. The existing proposed circuitry would be designed to handle these events also.

In some embodiments, the transformer secondary winding lower connection 220 shown in FIG. 2 could be directly connected to ground. The connection shown can be used to isolate the equipment being powered from the expected ground potential rise caused by a transient current event passing through the ground connection inductance. This ground connection may be many feet in length (for example, greater than 10 feet). For the connection shown, this potential rise would be isolated by the transformer.

DC Converter Implementation

Figure 3:
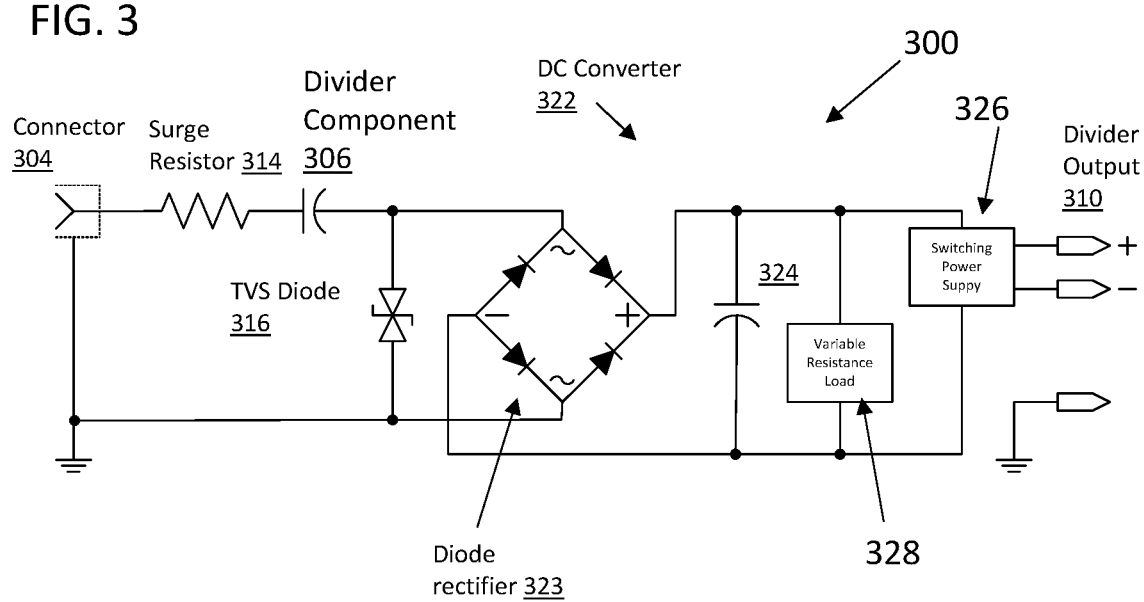
FIG. 3 shows a DC converter implementation of a voltage divider.

FIG. 3 illustrates one embodiment of a power supply device 300 that implements the divider voltage control impedance block from FIG. 1 as a DC converter 322. The connector 304, divider component 306, TVS diode 316, and divider output 310 correspond to the same structures as described in FIGS. 1 and 2 above. The power supply device 300 can further include diode rectifier 323, filter capacitor 324, switching power supply 326, and variable resistance load 328. The divider voltage is first fullwave rectified and filtered as shown in FIG. 3.

The switching power supply 326 is used to provide the DC power output of the device and to provide ground bounce transient voltage isolation during impulse events as previously described. A major advantage of this implementation is the magnetic component required is considerably smaller and lighter than that required for a 50 or 60 Hertz transformer. The voltage the small geometry transformer can support will drive the required size.

Divider output voltage control is provided by the variable resistance load 328 function shown in FIG. 3. This function provides a variable load that maintains a maximum voltage across filter capacitor 324. An example circuit for the function of the variable resistance load 328 is shown in FIG. 4A as variable resistance load 428.

Figure 4A:
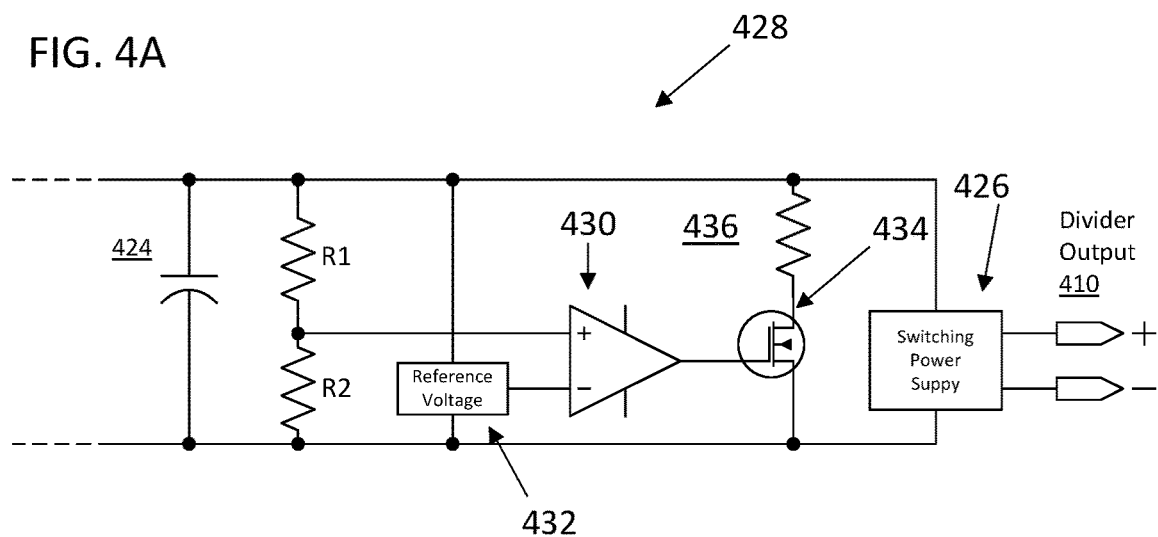
FIGS. 4A-4B shows circuits that implements a variable resistance load function.

Referring to FIG. 4A, when the voltage on the positive input of amplifier 430 is below the reference voltage 432, the transistor gate shown is driven low, turning off transistor 434. As the voltage on the positive input is increased above the reference voltage 432, the transistor turns on, drawing the necessary current to maintain the desired voltage across the filter capacitor. When the device is not connected to a load, resistor 436 will need to dissipate the design full power output (2 to 10 watts). This amount of power may be advantageously dissipated through the device earth ground connection. The resistor can be thermally bonded to the ground, but electrically isolated. The electrical isolation barrier would need to support the voltage across filter capacitor 424 plus a smaller transient ground bounce voltage.

Figure 4B:
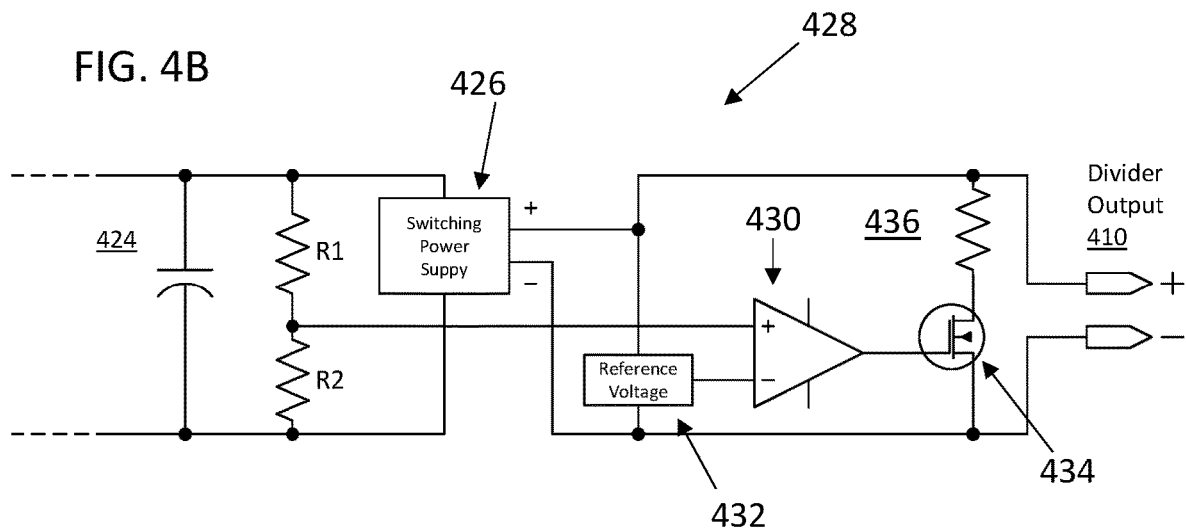

Another possible implementation of the circuit in FIG. 3 places the variable resistance load 328 at the output of the switching power supply. This implementation is illustrated in FIG. 4B. The components described in FIG. 4B correspond to the same structures as described above in FIG. 4A. This requires a signal that represents the voltage across filter capacitor 424 be available at the power supply output. This can be implemented as a high value resistive divider as the design does not require galvanic isolation. With this solution, resistor 436 can be thermally bonded to earth ground and require only readily available dielectric isolation solutions. This alternative implementation loses ground bounce isolation compared to the implementation of FIG. 4A, and the switching power supply must support the full design power load continuously. It has the minor advantage of providing a useable power supply for both the reference voltage and OP Amp functions. Both of these functions could be implemented with power supply current requirements of less than say, 100 uA. An inexpensive and reliable linear power source would dissipate 1000V*200 ua=200 mW.

All of the implementations described above, including the transformer implementation and the DC converter implementation, provide a divider voltage control impedance block (or circuit) that is configured to regulate the voltage on the divider output to support variable loads.

Elbow Connector

Figure 5:
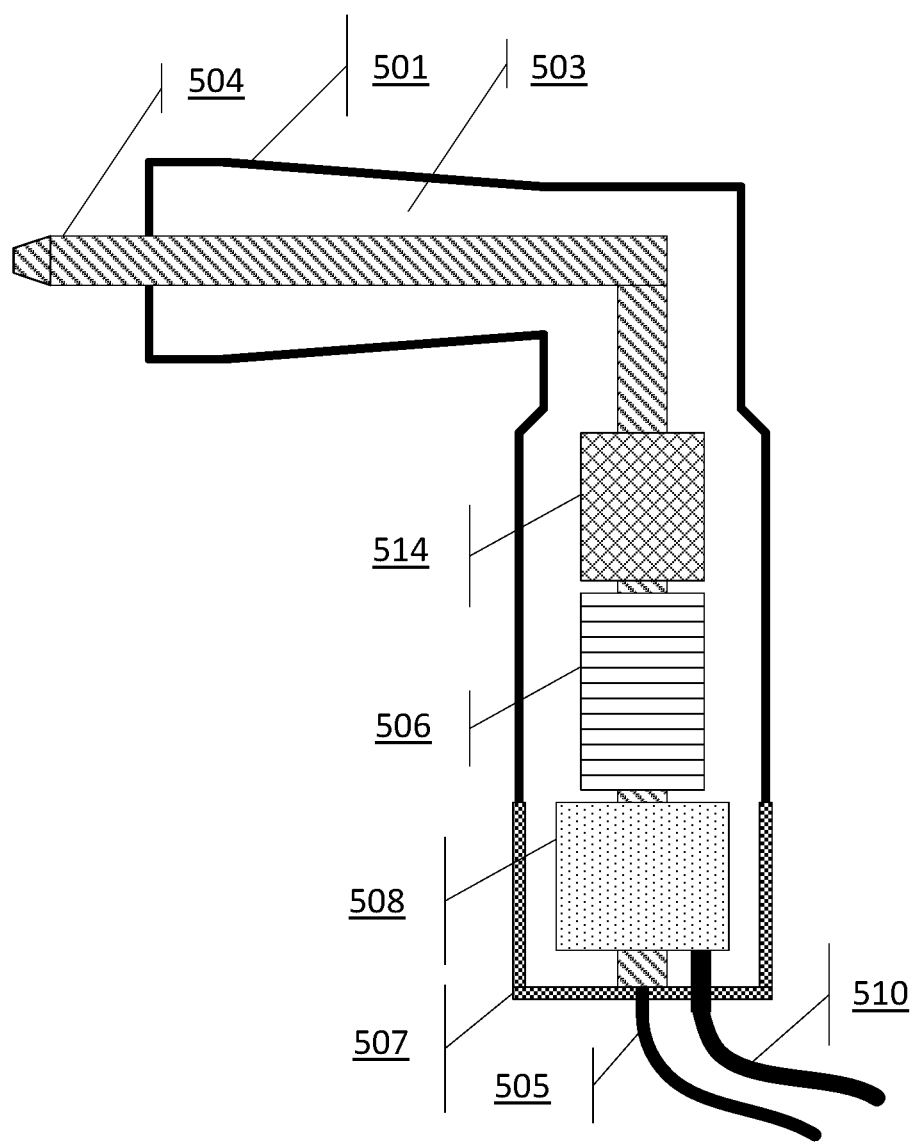
FIG. 5 is a side-view of one example of an elbow connector for an underground power system.

FIG. 5 illustrates a power supply device 500 that comprises an "elbow connector" housing 501. The device 500 can include many components described and illustrated above, including a connector 504 and insulation 503 disposed between the housing 501 and the connector 504. Device 500 can further include a surge resistor 514, divider component 506, divider voltage control electronics 508 (corresponding to divider voltage control impedance block 108 in FIG. 1), a ground wire 505, and a power supply cable which provides a divided output 510, as described above. In some embodiments, the elbow connector housing 501 can house all the illustrated components. However, in another embodiment, the housing 501 can house only the connector 504, insulation 503, surge resistor 514, and divider component 506, and an additional divider voltage control housing 507 can house the divider voltage control electronics 508. In this alternative embodiment, the additional divider voltage control housing 507 and divider voltage control electronics 508 can be modular and can be attached to a standard elbow connector to add-on the features described herein, namely the ability to regulate the voltage on the divider output to support variable loads.

The device 500 can be grounded and it also makes the ground connection to the outer housing. A separate ground wire and power supply cable are shown. These could be included as a single cable assembly, however it can be beneficial to separate them as shown for surge response performance as described above. The insulation 503 shown does not include insulation system design details required to manage the E-field gradients surrounding the connector components as well as the divider surge resistor and the divider component.

As for additional details pertinent to the present invention, materials and manufacturing techniques may be employed as within the level of those with skill in the relevant art. The same may hold true with respect to method-based aspects of the invention in terms of additional acts commonly or logically employed. Also, it is contemplated that any optional feature of the inventive variations described may be set forth and claimed independently, or in combination with any one or more of the features described herein. Likewise, reference to a singular item, includes the possibility that there are plural of the same items present. More specifically, as used herein and in the appended claims, the singular forms "a," "and," "said," and "the" include plural referents unless the context clearly dictates otherwise. It is further noted that the claims may be drafted to exclude any optional element. As such, this statement is intended to serve as antecedent basis for use of such exclusive terminology as "solely," "only" and the like in connection with the recitation of claim elements, or use of a "negative" limitation. Unless defined otherwise herein, all technical and scientific terms used herein have the same meaning as commonly understood by one of ordinary skill in the art to which this invention belongs. The breadth of the present invention is not to be limited by the subject specification, but rather only by the plain meaning of the claim terms employed.

What is claimed is:

1. A power supply device configured to power an electrical component with underground power lines, comprising:
   a connector configured to electrically couple the power supply device to a conductor of the underground power lines; and
   a voltage divider configured to receive an input voltage from the conductor, the voltage divider comprising a capacitor and divider voltage control electronics, the divider voltage control electronics comprising a variable resistance load circuit coupled across a diode rectifier and configured to maintain a maximum voltage across a filter capacitor, the diode rectifier in series with the capacitor; and,
   a surge resistor in series with the capacitor and configured to provide impulse protection from surge events;
   wherein the divider voltage control electronics are configured to regulate an output voltage of the voltage divider to support variable loads on the voltage divider.

2. A power supply device configured to power an electrical component with underground power lines, comprising:
   a connector configured to electrically couple the power supply device to a conductor of the underground power lines; and
   a voltage divider configured to receive an input voltage from the conductor, the voltage divider comprising a capacitor and divider voltage control electronics in series with the capacitor, the divider voltage control electronics comprising a transformer; and,
   a surge resistor in series with the capacitor and configured to provide impulse protection from surge events;
   wherein the divider voltage control electronics are configured to regulate an output voltage of the voltage divider to support variable loads on the voltage divider.

3. The device of claim 1, further comprising a switching power supply that provides DC power output.

4. The device of claim 3, the switching power supply isolated from ground.

5. The device of claim 1, the filter capacitor being in parallel with the variable resistance load circuit.

6. The device of claim 5, the variable resistance load circuit comprising:
   a resistor circuit including first resistor in series with a second resistor, the resistor circuit in parallel with the filter capacitor;
   a switching circuit including a transistor in series with a third resistor, the switching circuit in parallel with the filter capacitor;
   an amplifier, wherein a positive terminal of the amplifier coupled to a node between the first and the second resistor, a reference voltage input into a negative terminal of the amplifier, an output of the amplifier coupled to the transistor;
   wherein when voltage at the positive terminal is greater than the reference voltage, the switching circuit is configured to draw current across the filter capacitor.

7. The device of claim 6, wherein when the power supply device is not coupled to a load, the third resistor is configured to dissipate a design full power output via being thermally bonded and electrically isolated to earth ground.

8. The device of claim 5, the variable resistance load circuit comprising:
   a resistor circuit including first resistor in series with a second resistor, the resistor circuit in parallel with the filter capacitor;
   a switching power supply in parallel with the resistor circuit;
   a switching circuit including a transistor in series with a third resistor, the switching circuit coupled to an output of the switching power supply;
   an amplifier, wherein a positive terminal of the amplifier coupled to a node between the first and the second resistor, a reference voltage representing voltage across the filter capacitor input into a negative terminal of the amplifier, an output of the amplifier coupled to the transistor;
   wherein when voltage at the positive terminal is greater than the reference voltage, the switching circuit is configured to draw current across the filter capacitor.

9. The device of claim 8, wherein the switching power supply is configured to support a full design power load continuously.

10. The device of claim 8, wherein the third resistor is thermally bonded and dielectrically isolated to earth ground.

11. The device of claim 2, the capacitor being in series with a primary winding of the transformer.

12. The device of claim 11, further comprising a TVS diode placed in parallel with the primary winding.

13. The device of claim 11, the primary winding further coupled to ground.

14. The device of claim 2, the transformer including a magnetic core having magnetic core behavior that controls the maximum voltage available at a secondary winding of the transformer.

15. The device of claim 14, the magnetic core behavior characterized in that the magnetic core saturates as the input voltage increases above a target voltage.

16. The device of claim 2, the transformer including a secondary winding, one end of the secondary winding being coupled to ground.

17. The device of claim 2, the transformer including a secondary winding, the secondary winding being isolated from ground.

18. The device of claim 1, wherein the divider voltage control electronics are configured to regulate the output voltage of the voltage divider by limiting the output voltage of the voltage divider.

* * * * *